(12) United States Patent
Ting et al.

(10) Patent No.: US 6,429,710 B1
(45) Date of Patent: Aug. 6, 2002

(54) INPUT BUFFER WITH COMPENSATION FOR PROCESS VARIATION

(75) Inventors: Tah-Kang Joseph Ting, Hsinchu; Gyh-Bin Wang, Chung-Li; Chien-Te Wu, Hsinchu, all of (TW)

(73) Assignee: Etron Technology, Inc., Hsin-chu (TW)

( * ) Notice: Subject to any disclaimer, the term of this patent is extended or adjusted under 35 U.S.C. 154(b) by 0 days.

(21) Appl. No.: 08/709,896

(22) Filed: Sep. 9, 1996

(51) Int. Cl.[7] ............................................... H03K 3/037
(52) U.S. Cl. ...................................... 327/206; 327/170
(58) Field of Search ............................... 327/205, 206, 327/208, 210, 215, 217, 219, 225, 227, 228, 230, 170

(56) References Cited

U.S. PATENT DOCUMENTS

| | | | | |
|---|---|---|---|---|
| 4,563,594 A | * | 1/1986 | Koyama | 327/206 |
| 4,642,488 A | | 2/1987 | Parker | 307/475 |
| 4,763,021 A | | 8/1988 | Stickel | 307/475 |
| 5,034,623 A | * | 7/1991 | McAdams | 327/206 |
| 5,459,437 A | * | 10/1995 | Campbell | 327/206 |
| 5,534,804 A | * | 7/1996 | Woo | 327/205 |
| 5,594,361 A | * | 1/1997 | Campbell | 327/206 |

FOREIGN PATENT DOCUMENTS

| | | | | |
|---|---|---|---|---|
| JP | 360114021 | * | 6/1985 | 327/206 |
| JP | 363318813 | * | 12/1988 | 327/206 |

* cited by examiner

*Primary Examiner*—My-Trang Nuton
(74) *Attorney, Agent, or Firm*—George O. Saile; Stephen B Ackerman; William Robertson

(57) ABSTRACT

An improved input buffer circuit of the type having a chain of FET inverter circuits has an FET connected in a feedback loop that functions like a Schmidt trigger and counteracts a hysteresis effect that causes variations in the delay of the inverter circuits and compensation for process variation. An FET is connected to conduct in its source-drain circuit between one of the power supply terminals and the interconnection node of two of the inverters in the chain. The gate of FET is connected to receive a signal from the output of one of the inverters. The hysteresis effect is characterized by different rising and falling paths at one knee of the transfer curve that describes the switching operation. The channel type of the FET and the polarity of the power supply terminal are selected to provide feedback during the transition where the knee occurs.

17 Claims, 4 Drawing Sheets

INPUT BUFFER WITH COMPENSATION FOR PROCESS VARIATION

FIELD OF THE INVENTION

This invention relates generally to FET circuits for integrated circuit devices and more specifically it relates to an input buffer circuit.

INTRODUCTION

Semiconductor chips for processors and other binary logic applications commonly have an input buffer circuit connected between each binary signal input pad (input terminal) and the circuits on the same chip that process the input signal. (In some cases, output circuits are connected to the same pad, but these connections are not relevant to this description.) The input buffer restores the signal to the specified voltages that represent the logic values. These signal voltages are commonly called high (or up) and low (down). This terminology is a generalization of both the polarity and the amplitude of the actual signal levels.

The signal at the input of a buffer circuit does not switch instantaneously between the high and low values. Instead, this signal is a rising or falling ramp. As the input voltage rises, it reaches a level at which the buffer circuit begins to switch between its on and off states. This level is called the trigger point or the logic threshold voltage. Because the buffer circuit has a high gain, the buffer reaches its maximum output rapidly, and the voltage transition at the buffer output can be steeper than the signal transition at its input. With this high gain amplifying operation, an input buffer circuit can reshape the input signal to have the desirable fast transitions between the two voltage levels that represent the binary logic values.

One known buffer has several amplifying circuits connected in a chain between the pad and the circuits that process the input signal. The chain that will be discussed here has three amplifying circuits and each amplifying circuit helps to shape the input signal. In the terminology that will be used in this specification, the amplifier that is connected to the input pad will be called the first amplifier and its output node will be called the first output node. Similarly, the other two amplifiers in the chain and their inputs and outputs will be called second and third. Thus the first output and the second input form a common node and the second output and the third input form a common node.

In the buffer circuit that will be described, the second and third amplifiers are simple inverters. The first amplifying circuit is a logic gate connected as an inverter, as will be explained later, and it will be convenient to refer to the three amplifying circuits more specifically as first, second and third inverters. In this chain of inverters, the input to the second inverter and the output of the third inverter have the same phase (both up or both down), and this feature is significant in one embodiment of this invention.

For a CMOS (Complementary Metal Oxide Semiconductor) inverter, which includes one PMOS transistor and one NMOS transistor connected in series between a supply voltage and ground, as is known in the art, the logic threshold voltage can vary based on variation in the manufacturing process. Process variation causes differences in various transistor properties including $V_{tn}$ (NMOS voltage threshold), $V_{tp}$ (PMOS voltage threshold), electron mobility $\mu$, oxide thickness $t_{ox}$, and channel width and length.

One means of describing process variation refers to the driveability of the PMOS and NMOS devices. It is particularly troublesome when the PMOS devices has high driveability and the NMOS low, hereinafter referred to as PHNL (P high, N low), or the opposite case referred to as PLNH (P low, N high).

The switching operation of an FET inverter can be represented by a transfer curve (or plot) showing the gate voltage (the input voltage) along the horizontal axis and the output (the drain voltage or the drain current) along the vertical axis. In a simplified case, when the input voltage is low representing a logical 0 (to the left on the horizontal axis), the inverter FET is turned off and its output (on the vertical axis) is high, representing a logical 1.

Similarly, when the input voltage is in a higher range that represents a logical 1, the output is low, representing a logical 0. These two parts of the transfer curve are constant (horizontal) over a substantial range of the input voltage because the amplifier switches rapidly. These two regions are joined by a transition where the output switches in response to a change in the input voltage. The output switches at a point on the transition line that is called the trigger point, or logic threshold voltage.

Process variations change this simple relation between the input, and the transfer curve that more realistically represents the switching action of an FET inverter has partly different paths for a rising transition and a falling transition. The effect will be called "hysteresis." The term will be understood from hysteresis in a Schmitt trigger circuit and from hysteresis in magnetic materials.

This switching characteristic with different paths produces the adverse effect that the delays differ for propagating the signal for a logical 1 and a logical 0. Stated differently, the input-output characteristic curve may have one trigger point on a rising part of the characteristic and another trigger point on a falling part of the characteristic. The differences cause a circuit to switch at different levels of the input signal and thereby causes the delay through the circuit to have differing values, depending on whether the transition is high to low or low to high.

In case PLNH, the trigger point is low. A rising input signal reaches the trigger point after a relatively small change, and the inverter switches at a point that is lower on the input voltage ramp is therefore closer (in time) to the beginning of the ramp. The opposite effect occurs on a falling input signal because the input signal must fall farther to reach the trigger point. Thus the inverter switches after a greater delay for a falling input signal than for a rising input signal.

In case PHNL, the trigger point is high and the signal delay is opposite to the effect described for case PLNH. The inverter switches after a greater delay for a rising input signal than for a falling input signal.

The switching characteristics of buffer circuits will be discussed further in the description of the preferred embodiment of the invention.

SUMMARY OF THE INVENTION

The circuit of this invention has a chain of three amplifying circuits, a logic gate and two inverters, as in the prior art. One object of this invention is to overcome the effect of process variation in this buffer and thereby provide the same propagation time for all input signals.

This invention adds hysteresis producing components to the conventional buffer to offset the hysteresis produced by process variations.

In one embodiment of the invention, a p-channel FET (PMOS) is connected to conduct in its source-drain circuit between the first output terminal and ground. The gate terminal of this FET is connected to be controlled from the third output terminal. The first output (the drain of the FET) is in phase with the third output (because two inverters, the second and third, are connected between these nodes).

The PMOS FET acts to minimize the effect of process variation in the transfer curve characteristics of the buffer circuit of the invention.

THE DRAWINGS

THE PREFERRED EMBODIMENTS

Figure 1:
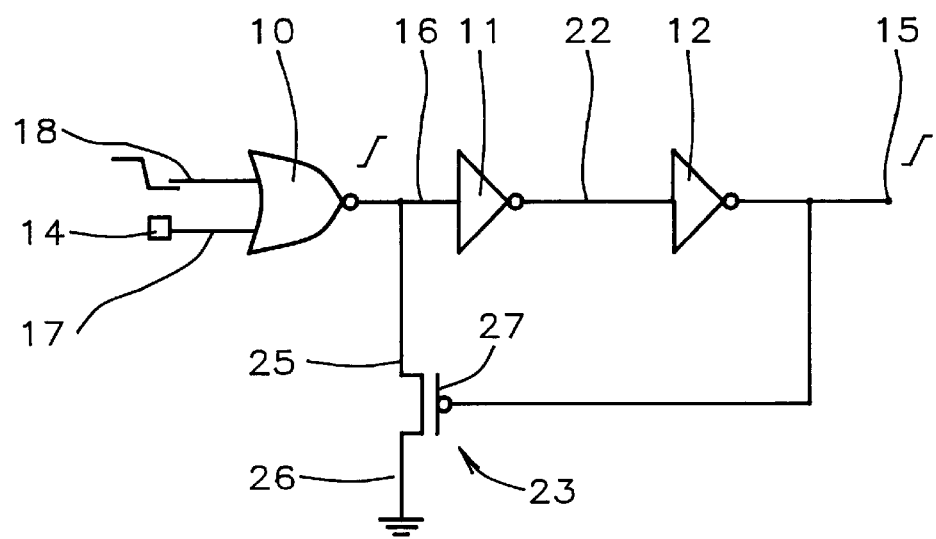
FIG. 1 is a schematic drawing of an input buffer circuit according to this invention using a p-channel FET in the feedback loop.

The Circuit of FIG. 1—Introduction

FIG. 1 shows a chain of three amplifying circuits 10, 11, 12 connected to transmit an input signal at an input pad 14 to a node 15 where circuits (not shown) are connected to receive the input signal. Circuits 11 and 12 are inverters and circuit 10 is a logic gate connected as an inverter. Preferably, circuit 10 is a NOR (OR-Invert) logic circuit. The logic circuit has two p-channel FETs connected in series between the output node and $V_{DD}$ and two n-channel FETs connected in parallel between the output node and ground. When the circuit is used as a simple inverter, one of the series FETs has its gate connected to ground so that it is always conducting, and one of the parallel FETs has its gate connected to ground so that it is always turned off; the other two FETs receive the input signal like a simple inverter formed by two FETs.

Logic gate 10 has an inverted output 16 and two inputs 17 and 18. (Reference character 16 and some other reference characters identify both a signal and the corresponding signal carrying line or node.) Input 17 is connected to receive the signal at device input pad 14. Input 18 is connected to receive a fixed voltage for a logic value that does not affect the operation of the gate (low for the OR Invert circuit of the drawing).

Line 16 connects the output of circuit 10 to the input of inverter 11, and a line 22 connects the output of inverter 11 to the input of inverter 12. In the terminology introduced earlier, reference character 16 identifies the first output and the second input and reference character 22 identifies the second input and the third output.

Figure 2:
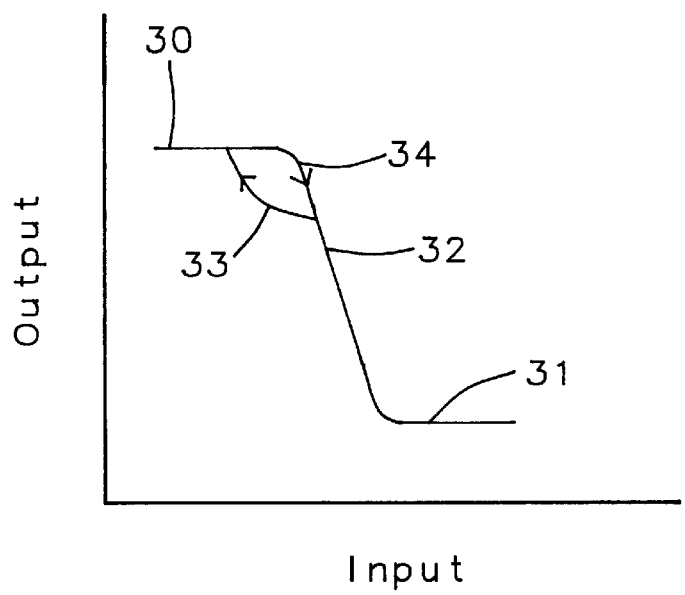
FIG. 2 is a diagram of a hysteresis curve illustrating the switching operation of the circuit of FIG. 1.

FIG. 2 shows a waveform at line 16 that rises from the voltage level for a logical 0 to the level for a logical 1. FIG. 2 also shows the same waveform as it has propagated to node 15. (The drawing does not represent the shaping effect of the intervening amplifiers.) The complementary falling waveform at these nodes is a mirror image about a horizontal axis of the waveforms shown in FIG. 2. The waveforms at nodes 14 and 15 is the complement of the waveforms at nodes 16 and 15.

The Feedback Loop of FIG. 1

This invention overcomes the effects of hysteresis by providing an FET 23 that is connected to conduct in its source-drain circuit between the output 16 of inverter 10 and ground 26 in response to a signal at its gate from the output 15 of inverter 12. Reference characters 25, 26 and 27 identify the drain, source and gate respectively. FET 23 is a p-channel FET and it turns on when the signal at node 15 is low and it turns off when the signal at node 15 is high.

When the signal at node 16 is low (before the rise of the two waveforms shown in FIG. 2), FET 23 is turned on in response, and it cooperates with circuit 10 in holding down node 16. When the signal at node 16 is high (after the rise of the two waveforms shown in FIG. 2), FET 23 is turned off in response to the up level signal at node 15, and it thereby permits node 16 to rise. Thus, FET 23 does not change the steady state operation of the circuit (represented by the horizontal parts of the waveforms in FIG. 2), but it affects the switching characteristic of the circuit, as follows.

Figure 2A:
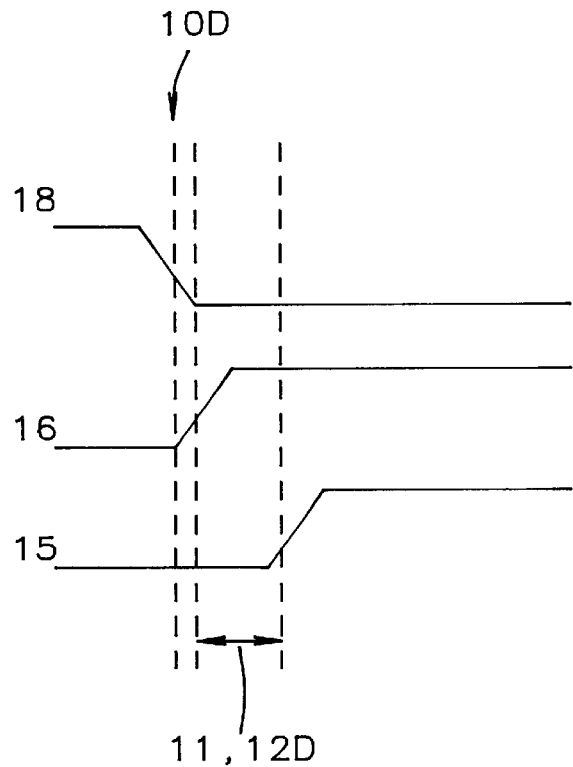
FIGS. 2A and 2B are waveforms illustrating operation of the circuit of FIG. 1.
Figure 2B:
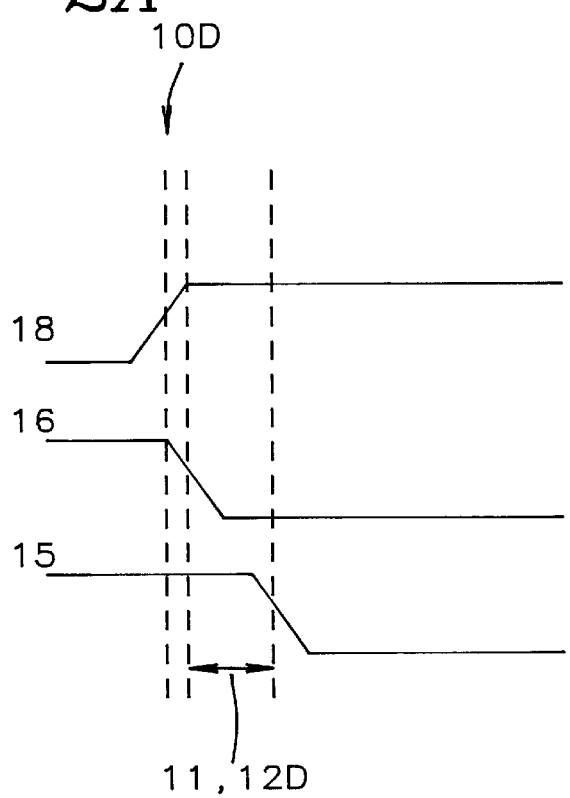

Referring now to FIGS. 2A and 2B, when circuit input 18 is high, corresponding to area 31 in FIG. 2, and then starts to switch to a low level, the first effect is to cause the output at node 16 to rise from low to high, delayed by gate 10 delay 10D. As node 16 completes its transition to a high level, node 15 is still at a low level. This keeps PMOS 23 on for a short time 11,12D (the combined gate delay of inverters 11, 12), thus causing conflict at node 16 with PMOS 23 trying to pull node 16 low but gate 10 trying to pull node 16 high. This leads output 15 to take the hysteresis branch 33 (see FIG. 2).

However, when input 18 rises from a low to a high level, as shown in FIG. 2B, no hysteresis occurs and branch 34 is taken. As input 18 rises, node 16 starts to fall, with a delay of 10D. Since output 15 is high at this point, PMOS 23 is off and there is no conflict at node 16. As 15 drops low after delay 11,12D, the PMOS device 23 turns on, connecting node 16 (already at a low voltage level) to ground.

While node 16 is low, as in the operating state just described, the input at pad 14 is high because gate 10 is an inverter. It can be seen from the forgoing description that logic gate 10 is not in the feedback loop, and it is not significant whether gate 10 is arranged as an inverting or non-inverting amplifier.

From a more general standpoint, FET 23 is of a channel type and it is connected to the power supply point ($V_{DD}$ or $V_{SS}$) to provide positive feedback in the loop it is part of during a predetermined switching direction (high output to low output in FIGS. 1 and 2).

The Transfer Curve of FIG. 2

The transfer curve of FIG. 2 shows the input of an FET on the horizontal axis and the output along the vertical axis, and it describes the operation of an inverter without the feedback circuit of FET 23. The transfer curve includes a high, generally flat, region 30 that represents (arbitrarily) a logical 1, and it has a low, generally flat, region 31 that represents a logical 0. The logical 0 output occurs when the input has a high value at a point on line segment 31, and the logical 1 output occurs when the input has a low value along line segment 30.

The path between the two logic representing levels has a part 32 that is common to both directions and two parallel parts 33 and 34. Arrows show the direction along the parallel paths. When the input at pad 14 is initially low and then rises, the operation of the inverter starts at the high constant level 30 and moves along this segment to the right. The operation then follows branch 34 of parallel path 33, 34 and common part 32 to the level 31 representing the new output. Similarly, in response to an input transition from high to low, the operation proceeds to the left on the lower constant output line 31, along common path 32, and then along the left most parallel path 33 to the high output level 30.

Notice that the parallel part of the transition path 33, 34 occurs only at the upper knee of the transfer curve of FIG. 2. The lower knee has the two single path parts 31, 32. As already explained, FET 23 turns on when the signal on lines 16 and 15 is rising. In effect, it prevents the operation along parallel branch 33 and instead forces an operation along a path that is represented in part by line 34.

Figure 3:
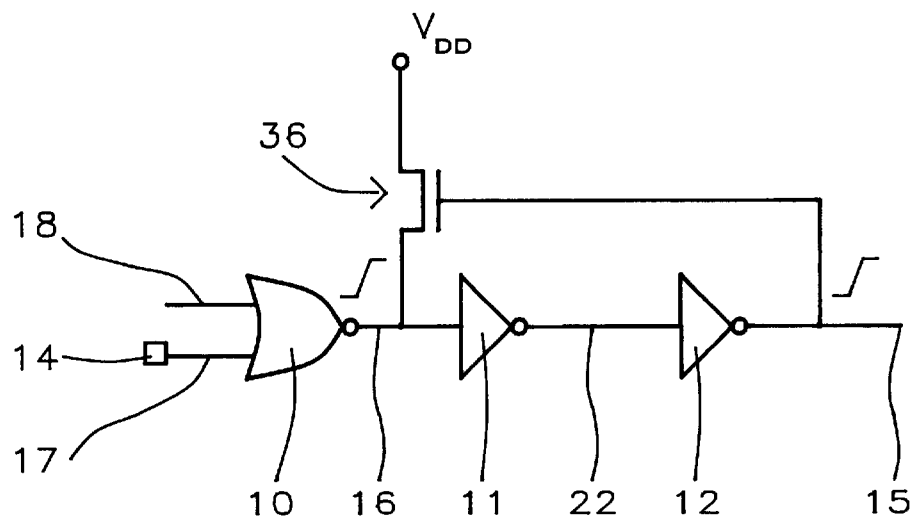
FIG. 3 is a schematic drawing of a input buffer circuit according to this invention using an n-channel FET in the feedback loop.
Figure 4:
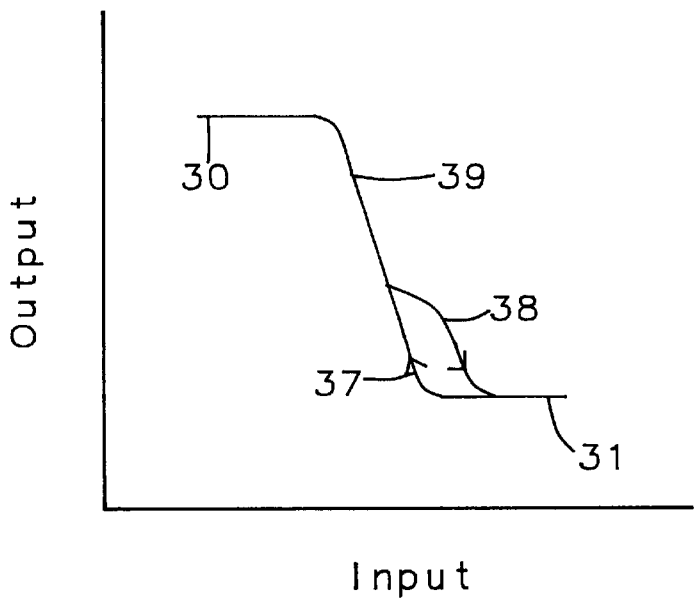
FIG. 4 is a diagram of a hysteresis curve illustrating the switching operation of the circuit of FIG. 3.

The Circuit of FIG. 3 and the Transfer Curve of FIG. 4

The chain of amplifiers 10, 11 and 12 and their inputs and outputs 14–18 and 22 will be familiar from the description of the circuit of FIG. 1. In this circuit the feed back loop includes an n-channel FET 36 that is connected to conduct in its source-drain circuit between node 16 and $V_{DD}$ when the output at node 15 is high. When output 15 is high, FET 36 cooperates with inverter 10 pull up node 16 to pull up node 16. When node 15 is down, FET 36 is turned off and allows inverter 10 to pull down node 16. Thus, FET 36 forms part of a feedback loop that enhances the switching operation on a low to high transition, as will be understood from the previous description of the circuit of FIG. 1.

Figure 4A:
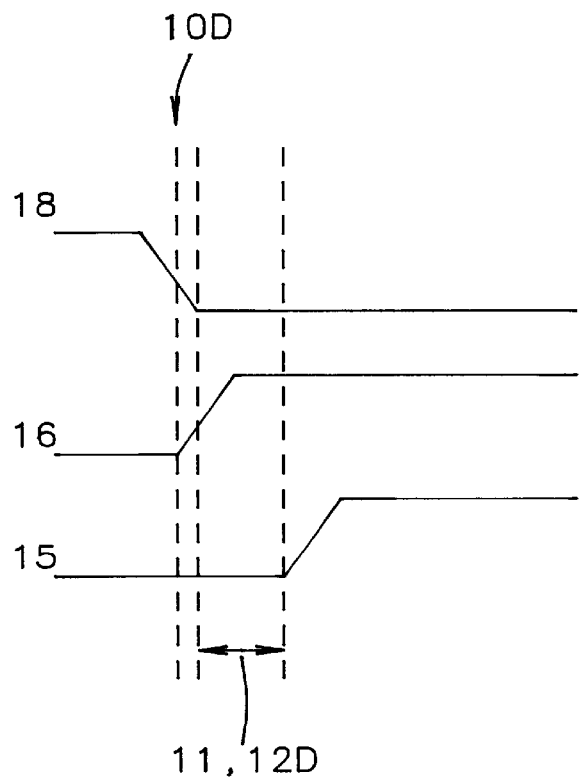
FIGS. 4A and 4B are waveforms illustrating operation of the circuit of FIG. 3.
Figure 4B:
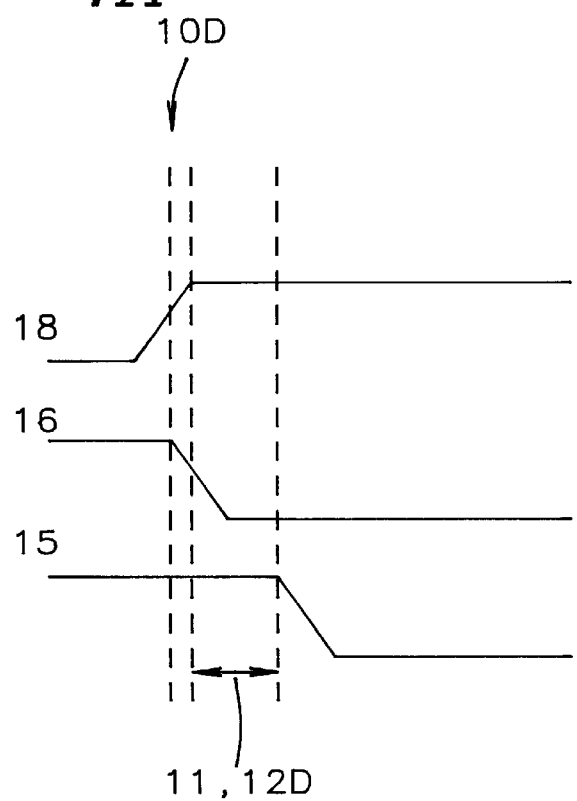

Referring now to FIGS. 4A and 4B, when circuit input 18 is high, corresponding to area 31 in FIG. 4, and then starts to switch to a low level, the first effect is to cause the output at node 16 to rise from low to high, delayed by gate 10 delay 10D. As node 16 completes its transition to a high level, node 15 is still at a low level. This keeps NMOS 36 off during the time 11,12D, and when output 15 subsequently rises, NMOS 36 is turned on, connecting already high node 16 to VDD. Thus output node 15 follows the path along areas 31, 37 and 34 of FIG. 4.

Referring to FIG. 4B, when input 18 moves from a low to high level, on the other hand, NMOS 36 is left on during period 11,12D, despite node 16 trying to be driven low by gate 10, thus following the transfer curve in FIG. 4 along the hysteresis branch 38.

The transfer curve of FIG. 4 has the high and low regions 30 and 31 of FIG. 2. However, the parallel branches 37, 38 and a common transition path part 39 in this transfer curve are reversed from FIG. 2. In the circuit of FIG. 3, the parallel branches 37, 38 appear at the lower knee. To overcome the hysteresis of FIG. 4, FET 36 turns on during the low to high (31 to 30) transition and in effect causes the operation to proceed along a single path that is represented in part by parallel branch 38.

The novel circuit of the invention may be used, for example, in an input circuit which has a tight setup/hold time specification. Without the inventive circuit, process variation may lead to insufficient setup and/or hold time, where, for example, a clock signal (at the buffer circuit output) goes invalid prior to the date being sampled. By adding the feedback FET of the invention, process variation has little effect on overall circuit operation. It will be understood by those skilled in the art that such a circuit is useful in many other applications.

OTHER EMBODIMENTS

From the description of the preferred embodiments of the invention, those skilled in the art will recognize various modifications within the spirit of the invention and the intended scope of the claims.

What is claimed is:

1. A buffer circuit of the type having a chain of amplifying circuits (10, 11, 12) connected output to input between an input pad of a semiconductor chip and circuits that process an input signal at the pad, the chip having two power supply terminals, the chain including a first circuit (10) having its output connected to the input of a second amplifying circuit, the second circuit having an input and an output, the transfer curve for the switching operation of the first circuit having high and low substantially constant output levels (30, 31) representing binary logic values in response to the input signal and having a steep transition between the high and low output levels and having hysteresis wherein the transition has parallel paths at one knee joining a constant part of the curve to the transition part of the transfer curve, wherein the improvement comprises, an FET (23 or 36) connected to conduct between the output of the first circuit and one of the power supply terminals in response to a gate signal from an output (15) of a circuit (12) in the chain to form a feedback loop, the channel type of the FET, the phase of its gate signal with respect to the output of the first circuit, and the polarity of the power supply terminal being selected to turn on the FET during a switching transition near the knee of the transfer curve having the two parallel paths.

2. The buffer circuit of claim 1 wherein the first circuit (10) includes an FET circuit having its threshold voltage established by the ratio of the channel width to the channel length.

3. The buffer circuit of claim 1 wherein the hysteresis is associated with variations in the process for manufacturing the buffer circuit.

4. The buffer circuit of claim 1 wherein the FET and the first circuit cooperate to produce a transition at the output of the first circuit that is rapidly in comparison with the transition of the input signal and thereby reduces the effect of timing variations.

5. The buffer circuit of claim 1 wherein the circuit supplying the gate signal (15) to said FET is a third circuit (12) having an input and an output and, and the buffer circuit has means (22) connecting the output of the second circuit (11) to the input of the third circuit.

6. The buffer circuit of claim 1 wherein the gate signal (15) for the FET is in phase with the output (16) of the first circuit and wherein the output of the first circuit and the input of the second circuit are isolated from the power supply terminals except for said FET.

7. The buffer circuit of claim 6 wherein the parallel paths are located at the threshold for a high to low transition in the output of the first circuit, and wherein the FET is a p-channel FET and the power supply terminal to which the FET is connected is ground, whereby the FET turns on to pull down the output of the first circuit.

8. The buffer circuit of claim 6 wherein the parallel paths are located at the threshold for a low to high transition in the output of the first circuit, and wherein the FET is an n-channel FET and the power supply terminal to which the FET is connected is positive, whereby the FET turns on to pull up the output of the first circuit.

9. An improved buffer circuit comprising a plurality of FET binary circuits (10, 11, 12) connected to propagate a signal at an input node (14) to an output node (15) wherein the switching characteristic of the circuits is variable and tends to cause variation in the time for propagating the signals, the transfer curve for the switching operation of the circuits having high and low substantially constant output levels (30, 31) representing binary logic values in response to an input signal and having a steep transition between the high and low output levels and having hysteresis wherein the transition has parallel paths at one knee joining a constant part of the curve to the transition part of the transfer curve, the signal at the output node (15) having the same phase as the signal at a node (16) common to the output of one of the binary circuits and the input of the next binary circuit, and an FET having its drain and source terminals connected to conduct between said common node and one of the power supply terminals (24) and having its gate terminal (27) connected to receive the signal at the output terminal, the FET being of a channel conductivity type and the power supply terminal being of a polarity to establish a feedback loop during a switching transition near the knee of the transfer curve having the two parallel paths, giving the circuit a hysteresis characteristic compensating for the variation in propagation time process and otherwise present in the plurality of connected circuits.

10. The buffer circuit of claim 9 wherein the input node is an input pad of an integrated circuit device and the buffer circuit forms an input buffer circuit.

11. The buffer circuit of claim 10 wherein the plurality of FET binary circuits comprises first, second and third binary circuits each having an input and an output and being connected in a chain between the input node and the output node and wherein the input of the first circuit is connected to the input node and the output of the third circuit forms the output node.

12. The buffer circuit of claim 11 wherein the common node is the output of the first circuit and the input of the second circuit.

13. The buffer circuit of claim 12 wherein the FET is connected to conduct between the common node and ground when the output of the first circuit is low and wherein the input signal is a data signal.

14. The buffer circuit of claim 12 wherein the FET is connected to conduct between the common node and VDD when the output of the first circuit is high and wherein the input signal is a clock signal.

15. The buffer circuit of claim 14 wherein the second and third binary circuit devices are inverters and logic phase of the signal at said output is the same as the signal at the common node.

16. The buffer circuit of claim 15 wherein the FET is a p-channel FET connected to conduct between the common node and ground when the output of the first circuit and the output of the third circuit are both low and wherein the input signal is a data signal.

17. The buffer circuit of claim 13 wherein the FET is an n-channel FET connected to conduct between the common node and VDD when the output of the first circuit and the output of the third circuit are both high and wherein the input signal is a clock signal.

* * * * *

UNITED STATES PATENT AND TRADEMARK OFFICE
CERTIFICATE OF CORRECTION

PATENT NO. : 6,429,710 B1 Page 1 of 1
APPLICATION NO. : 08/709896
DATED : Ting et al.
INVENTOR(S) : August 6, 2002

It is certified that error appears in the above-identified patent and that said Letters Patent is hereby corrected as shown below:

On the title page,
[*] delete "0" and insert --925--.

Signed and Sealed this

Fifth Day of December, 2006

JON W. DUDAS
*Director of the United States Patent and Trademark Office*